(12) United States Patent
Nakano et al.

(10) Patent No.: US 7,102,461 B2
(45) Date of Patent: Sep. 5, 2006

(54) SURFACE ACOUSTIC WAVE ELEMENT, SURFACE ACOUSTIC WAVE DEVICE, SURFACE ACOUSTIC WAVE DUPLEXER, AND METHOD OF MANUFACTURING SURFACE ACOUSTIC WAVE ELEMENT

(75) Inventors: Masahiro Nakano, Tokyo (JP); Akira Mashimo, Tokyo (JP); Katsuo Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 162 days.

(21) Appl. No.: 10/895,911

(22) Filed: Jul. 22, 2004

(65) Prior Publication Data
US 2005/0030125 A1    Feb. 10, 2005

(30) Foreign Application Priority Data
Jul. 28, 2003    (JP)    .......................... P2003-281301

(51) Int. Cl.
H03H 9/72    (2006.01)
H03H 9/64    (2006.01)
H03H 3/08    (2006.01)

(52) U.S. Cl. ...................... 333/133; 333/193; 427/100; 29/25.35

(58) Field of Classification Search ................ 333/193, 333/133
See application file for complete search history.

(56) References Cited

U.S. PATENT DOCUMENTS

| | | | |
|---|---|---|---|
| 5,162,690 A | 11/1992 | Ieki et al. ................ 310/313 R |
| 5,873,153 A | 2/1999 | Ruby et al. ................. 29/25.35 |
| 5,939,817 A * | 8/1999 | Takado ........................ 310/348 |
| 6,087,756 A * | 7/2000 | Shibutani ................ 310/313 B |
| 6,181,015 B1 | 1/2001 | Gotoh et al. ................. 257/778 |
| 6,407,486 B1 | 6/2002 | Kimura et al. .............. 310/364 |
| 6,414,415 B1 * | 7/2002 | Shibutani et al. ........ 310/313 R |
| 6,552,475 B1 * | 4/2003 | Hori et al. ................... 310/364 |
| 6,731,046 B1 * | 5/2004 | Watanabe et al. ........ 310/313 R |
| 6,817,071 B1 * | 11/2004 | Taga ......................... 29/25.35 |
| 6,911,762 B1 * | 6/2005 | Sakaguchi et al. ...... 310/313 R |
| 2003/0067369 A1 | 4/2003 | Nakano et al. ............. 333/193 |
| 2004/0056561 A1 | 3/2004 | Kam et al. .............. 310/313 B |

FOREIGN PATENT DOCUMENTS

| | | | | |
|---|---|---|---|---|
| EP | 0 939 485 A1 | 9/1999 | | |
| JP | A-55-49014 | 4/1980 | | |
| JP | 59-232432 | * 12/1984 | .......... 257/E21.506 |
| JP | A-6-132777 | 5/1994 | | |
| JP | B2-2545983 | 8/1996 | | |
| JP | 11-234082 | * 8/1999 | | |

(Continued)

*Primary Examiner*—Barbara Summons
(74) *Attorney, Agent, or Firm*—Oliff & Berridge PLC

(57) ABSTRACT

In a surface acoustic wave element according to an embodiment of this invention, raised electrodes 20 formed on thin film electrodes 18 are provided with throughholes 31. Additionally, bumps 26 arranged on the raised electrodes 20 reach the thin film electrode 18 by going through an oxide film 18a of the thin film electrodes 18 after part of the bumps enters the throughholes 31 of the raised electrodes 20. By doing this, conduction is achieved between the thin film electrodes 18 and the bumps 26 formed on a piezoelectric monocrystal substrate 28. Thus, a solid oxide film 18a is formed on the surface of the thin film electrodes 18 formed from monocrystal aluminum, but part of the bumps 26 which enters the throughholes 31 of the raised electrodes 20 goes through this oxide film 18a, so conduction between the thin film electrode 18 and the bump 26 is achieved with higher accuracy.

17 Claims, 7 Drawing Sheets

FOREIGN PATENT DOCUMENTS

| | | |
|---|---|---|
| JP | B2-3172124 | 3/2001 |
| JP | A-2003-101372 | 4/2003 |
| WO | WO 00/74235 A1 | 12/2000 |
| WO | WO 01/93420 A1 | 12/2001 |

* cited by examiner

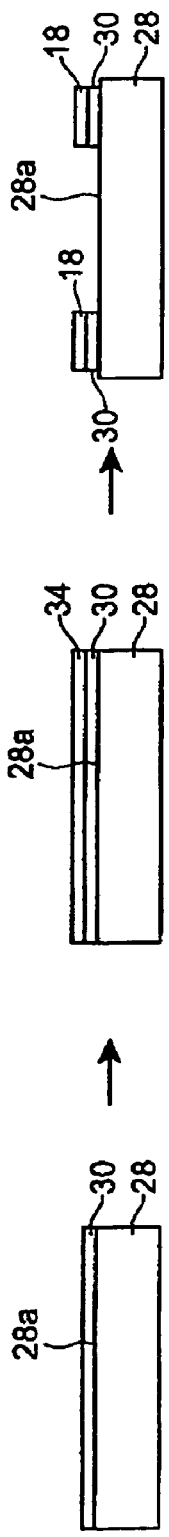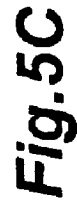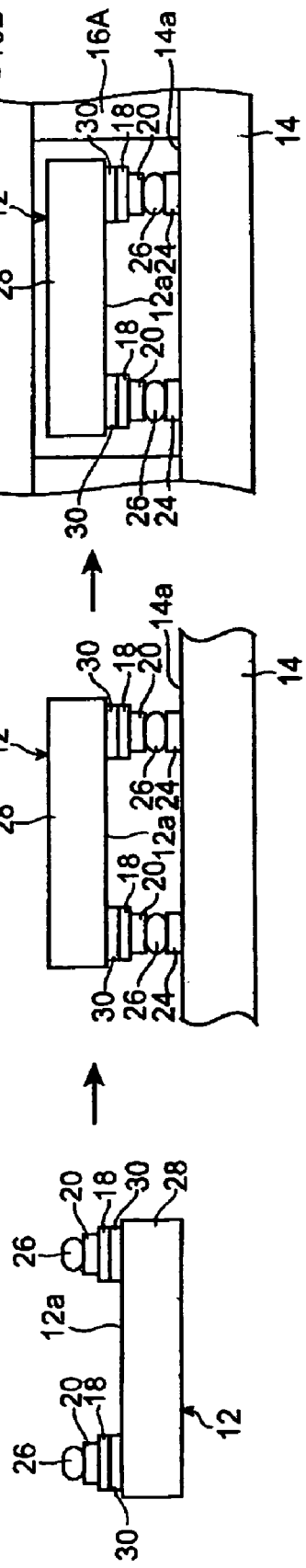

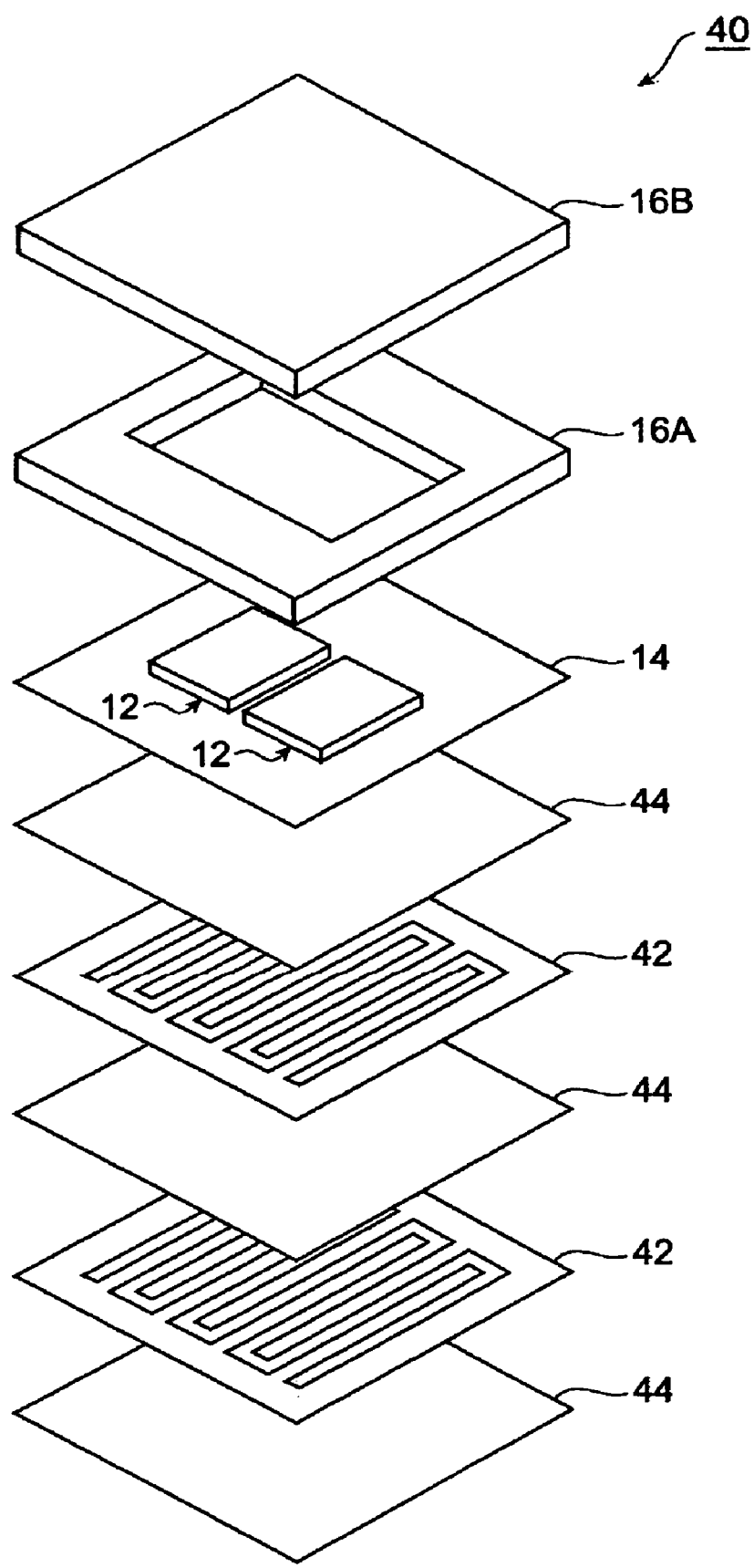

SURFACE ACOUSTIC WAVE ELEMENT, SURFACE ACOUSTIC WAVE DEVICE, SURFACE ACOUSTIC WAVE DUPLEXER, AND METHOD OF MANUFACTURING SURFACE ACOUSTIC WAVE ELEMENT

RELATED APPLICATION

Japanese Patent Application No. 2003-281301 filed on Jul. 28, 2003, from which priority is claimed, is hereby incorporated herein by reference in its entirety.

BACKGROUND OF THE INVENTION

1. Field of the Invention

This invention relates to surface acoustic wave elements, surface acoustic wave devices, surface acoustic wave duplexers, and to methods of manufacturing surface acoustic wave elements.

2. Related Background Technology

Recently, instead of a filter using dielectrics and a resonator, there are more cases in which a surface acoustic wave filter and a surface acoustic wave resonator, which are types of surface acoustic wave devices, are used for a high frequency circuit of a mobile communication device, such as a portable telephone, a cordless telephone, and the like. This is because the dimension of the surface acoustic wave filter is smaller than that of a dielectric filter, and one in the same size have advantage in the electrical characteristics.

This type of surface acoustic wave device is mainly provided with a piezoelectric substrate, a comb electrode (Inter Digital Transducer, hereafter referred to as "IDT") obtained by forming an electrode film laminated on the piezoelectric substrate, and a package that accommodates the piezoelectric substrate and the IDT. Lithium niobate ($LiNbO_3$), lithium tantalate ($LiTaO_3$), quartz, or the like is used as a material of the piezoelectric substrate. In particular, when an RF band filter is manufactured, there are many cases in which lithium niobate and lithium tantalate having high electro-mechanical coupling coefficients are used. Lithium niobate has a large electro-mechanical coupling coefficient, so a substrate with a 64°-rotated Y-cut is used. In addition, lithium tantalate has a high electro-mechanical coupling coefficient and a relatively small temperature coefficient of frequency, so a substrate with a 34–44°-rotated Y-cut is used. Furthermore, in many cases, aluminum with a characteristic of low density and low electrical resistivity is used for a material of an electrode film.

As described above, there are many cases in which a surface acoustic wave device is used for a portable telephone or the like in an RF band (800 MHz–2 GHz). Additionally, for example, when a surface acoustic wave device is used in a 1 GHz band, and large repeated stresses, which are proportional to the frequency during operation, are added to the IDT on the piezoelectric substrate, there was a problem that life duration (lifetime) of the surface acoustic wave device is shortened because migration of aluminum atoms due to the repeated stresses is generated, and defects such as hillocks (protrusions), voids (depletions), and the like are generated in the IDT. That is, electrical durability of the IDT (i.e., the electrode film) becomes an extremely important factor for the lifetime of the device. In addition, a deterioration phenomenon of the IDT significantly appears due to the increase in applied voltage in addition to the shift to high frequency operation. Furthermore, in terms of designing the device, as the frequency increases, the electrode film must be made thinner, and the electrode width must be made narrower. As a result, this type of deterioration phenomenon increases.

Meanwhile, with respect to a duplexer that occupies a large space in a high frequency circuit of a portable phone, it is proposed that a conventional dielectric duplexer should be changed to a small surface acoustic wave duplexer. However, this surface acoustic wave duplexer is an extremely small component, and there was a problem of electrical durability against a large electric power applied particularly to the sending side of the duplexer. Furthermore, as an IDT formation area of the surface acoustic wave device is designed to be large, it is possible to increase the electrical durability by reducing an effective electric power density. However, in this case, there is a problem that the device cannot be made smaller than a certain size.

Due to the above-mentioned reasons, improvement of the electrical durability of the IDT of surface acoustic wave devices, i.e., the electrical durability of the electrode film formed on the piezoelectric substrate is strongly demanded.

It is well known that the diffusion of aluminum at crystal grain boundaries is faster than inside the crystal grains. It is considered that controlling the diffusion at the grain boundary has priority. Therefore, it has been considered that the above-mentioned migration of the aluminum atoms due to repeated stress mainly occurs at crystal grain boundaries. This has conventionally been addressed. Because of this, it has been predicted that electrical durability can be significantly improved by reducing or removing crystal grain boundaries of, or, more preferably, monocrystallizing, an aluminum electrode film.

Therefore, Japanese Laid-Open Patent Application 55-49014 discloses a technology in which an electrode film is substantially made to be monocrystalline. An object of such technology is to improve a performance capability of a surface acoustic wave device regardless of a substance constituting a material of the device.

In addition, Japanese Patent Publication 2545983 discloses a technology which applies, as an electrode film of the surface acoustic wave device, an aluminum film of monocrystal or in which the crystal direction is oriented in a constant direction. In this publication, a Y-cut quartz substrate in the range from 25°-rotated Y-cut to 39°-rotated Y-cut is used as a piezoelectric substrate and is deposited at a high speed (film formation speed: 4 nm/seconds) and at a low temperature (substrate temperature: 80° C.), and thereby an orientation film (311) is obtained. This film is an epitaxial film which is similar to monocrystal.

Japanese Laid-Open Patent Application 6-132777 discloses a technology related to an aluminum monocrystal electrode film different from the one disclosed in the above-mentioned Japanese Laid-Open Application 55-49014. This reference discloses that an aluminum monocrystal film can be obtained if a film is formed at an extremely low speed. More specifically, formation of an aluminum monocrystal film on an LST cut quartz substrate according to a vacuum deposition method, formation of an aluminum monocrystal film on a 128°-rotated Y-cut lithium niobate substrate according to the vacuum deposition method, and formation of an aluminum monocrystal film on a 112°-rotated X-cut lithium tantalate substrate according to the vacuum deposition method are possible.

International Publication No. WO 00/74235 discloses that a 38–44°-rotated Y-cut lithium tantalate monocrystal substrate is used as a piezoelectric substrate, an interdigital-type electrode includes a titanium base metal film and an aluminum film formed thereon, and the aluminum film becomes a monocrystal film due to the effect of the titanium base metal film. Furthermore, Japanese Laid-Open Patent Application 2003-101372 discloses a surface acoustic wave device provided with a piezoelectric substrate formed of lithium tantalate or lithium niobate 33°±9°-rotated Y-cut, one of a titanium nitride buffer layer, a multi-layer buffer layer in which titanium nitride and titanium metal are laminated, and an inclined composition buffer layer where the composition changes gradually from titanium nitride and titanium metal, laminated on the substrate, and a monocrystal aluminum laminated on the buffer layer.

SUMMARY OF THE INVENTION

Recently, in the field of a portable telephone terminal in which a plurality of filters are mounted, making a surface acoustic wave device more compact is strongly demanded. That is, a so-called dual type portable telephone terminal recently has become mainstream, which can be used by a plurality of frequency bands, e.g., GSM type and DCS1800 type (Europe), and CDMA of AMPS band and CDMA of PCS band (United States). A circuit corresponding to a plurality of communication methods must be accommodated within one portable telephone terminal, so there is a need for making dimensions of each part, such as a filter smaller than before.

Because of this, with respect to mounting of a surface acoustic wave device, flip-chip mounting has become the center of public attention, in which compared to conventional wire bonding mounting, a small space for mounting is required and characteristics are stable. There are mainly two methods for this flip-chip mounting. One method uses a solder bump, and mounts a surface acoustic wave device by melting the solder bump. Another method uses a gold bump and mounts a surface acoustic wave device by ultrasonic joining. The following describes the details of the ultrasonic joining technology. A bump such as gold or the like is formed on an aluminum pad electrode of a surface acoustic wave element. In a state in which a surface on which the bump is formed faces a printed wiring board, the bump of the element and an Au electrode terminal of the printed wiring board are thermo-compression bonded. In this thermo-compression bonding process, the bump and the electrode terminal are joined by vibrating the surface acoustic wave element with ultrasonic waves, and a strong joint with reliable conduction is accomplished.

Furthermore, when a surface acoustic wave device is manufactured by flip-chip mounting a surface acoustic wave element onto a mounting substrate, the surface acoustic wave element is supported by a bump electrode only, so a certain degree of joint strength is demanded for the bump electrode. Because of this, in many cases, a pad electrode of the surface acoustic wave element on which a bump electrode is formed is raised by a raised electrode or the like. A method of raising a pad electrode is disclosed in, for example, Japanese Patent Publication 3,172,124 or the like.

However, when a surface acoustic wave device is manufactured by flip-chip mounting the above-mentioned conventional surface acoustic wave element, the following problem exists. That is, on a surface of a monocrystalline aluminum of a piezoelectric substrate, at the time of etching formation or the like, a solid, fine, natural oxide film is formed. Because of this, this type of insulative natural oxide film prevents conduction between a raised electrode and a thin film electrode formed from a monocrystalline aluminum electrode film.

This invention addresses the above-mentioned problem. An object of this invention is to provide a surface acoustic wave element which performs conduction with an external connection terminal with high accuracy even if an electrode film is a monocrystal, a surface acoustic wave device, a surface acoustic wave duplexer, and a method of manufacturing a surface acoustic wave element.

A surface acoustic wave element according to one aspect of the present invention is provided with a thin film electrode which is formed on a piezoelectric monocrystal substrate via a buffer layer, and is formed from monocrystal aluminum having an oxide film on a surface thereof; a raised electrode which is formed on the thin film electrode and is provided with a throughhole; and an external connection terminal which is arranged on the raised electrode, part of an external connection terminal entering the throughhole, going through the oxide film, and being electrically connected to the thin film electrode.

Furthermore, a surface acoustic wave device according to one aspect of the present invention is provided with a surface acoustic wave element provided with a thin film electrode which is formed on a piezoelectric monocrystal substrate via a buffer layer, and is formed from monocrystal aluminum having an oxide film on a surface thereof, a raised electrode which is formed on the thin film electrode and is provided with a throughhole, and an external connection terminal which is arranged on the raised electrode, part of an external connection terminal entering the throughhole, going through the oxide film, and being electrically connected to the thin film electrode; and a mounting substrate having an electrode terminal formed on a surface on which the surface acoustic wave element is mounted, the surface acoustic wave element being mounted on the mounting substrate so that the electrode terminal and the raised electrode of the surface acoustic wave element are connected via the external connection terminal.

Additionally, a surface acoustic wave duplexer according to one aspect of the present invention is provided with a surface acoustic wave element provided with a thin film electrode which is formed on a piezoelectric monocrystal substrate via a buffer layer, and is formed from monocrystal aluminum having an oxide film on a surface thereof, a raised electrode which is formed on the thin film electrode and is provided with a throughhole extending in a height direction, and an external connection terminal which is arranged on the raised electrode, part of the external connection terminal entering the throughhole, going through the oxide film, and being electrically connected to the thin film electrode.

With respect to the surface acoustic wave element, the surface acoustic wave device, and the surface acoustic wave duplexer, part of the external connection terminal arranged on the raised electrode enters a throughhole of the raised electrode and is electrically connected to the thin film electrode by going through an oxide film of the thin film electrode. Thus, according to one aspect of this invention, on the surface of the thin film electrode formed from monocrystal aluminum, a solid oxide film is formed, but part of the external connection terminal which enters the throughhole of the raised electrode goes through this oxide film, so conduction between the thin film electrode and the external connection terminal can be achieved with higher accuracy.

Furthermore, it is preferable that the external connection terminal is a gold bump terminal. A gold bump is generally used as an external connection terminal, so it can be easily formed by using conventional equipment.

Additionally, it is preferable that an adhesion reinforcement layer which improves adhesion between the thin film electrode and the raised electrode is inserted therebetween. In particular, it is preferable that this adhesion reinforcement layer is formed from chrome.

Furthermore, between the thin film electrode and the raised electrode, it is preferred that a dispersion barrier layer is inserted which suppresses dispersion of the atoms constituting the external connection terminal to the thin film electrode. In particular, it is preferred that the dispersion barrier layer is formed from titanium nitride.

In addition, it is preferred that the raised electrode is formed from aluminum or gold-aluminum alloy. Furthermore, it is preferred that a buffer layer: (1) is formed from one of titanium and titanium nitride, (2) has a laminated structure of at least two layers including a titanium layer and a titanium nitride layer, or (3) has a gradually decreasing composition ratio of nitrogen such that the buffer layer gradually changes from titanium nitride to titanium as it approaches a layer growth surface.

The surface acoustic wave element according to another aspect of this invention is provided with a thin film electrode which is formed on a piezoelectric monocrystal substrate via a buffer layer, and is formed from monocrystal aluminum having an oxide film on a surface thereof, and a raised electrode which is formed on the thin film electrode and has a throughhole.

When this surface acoustic wave element is mounted on a mounting substrate, a predetermined external connection terminal is pressed against the raised electrode. This external connection terminal is pressed so that part of the external connection terminal enters the throughhole of the raised electrode. At the same time, by vibrating the external connection terminal, the external connection terminal which entered the throughhole is made to pass through the oxide film of the thin film electrode surface, and the external connection terminal is made to reach the thin film electrode. By doing this, conduction is achieved between the thin film electrode and the external connection terminal formed on the piezoelectric monocrystal substrate. Thus, according to the surface acoustic wave element of this embodiment, the solid oxide film is formed on the surface of the thin film electrode constituted by monocrystal aluminum, but the throughhole is arranged in the raised electrode. Therefore, by entering part of the external connection terminal to the throughhole and going through the oxide film, conduction between the thin film electrode and the external connection terminal can be achieved with higher accuracy.

A method of manufacturing a surface acoustic wave element according to one aspect of the present invention, includes the steps of: laminating a buffer layer on a piezoelectric monocrystal substrate; laminating an electrode film formed from monocrystal aluminum on the piezoelectric monocrystal substrate via the buffer layer; forming a thin film electrode by patterning the electrode film and forming an oxide film on a surface of the thin film electrode; forming a raised electrode having a throughhole on the thin film electrode; pressing an external connection terminal against the raised electrode and causing a part of the external connection terminal to enter the throughhole; and vibrating the external connection terminal, causing the external connection terminal that has entered the throughhole to go through the oxide film of the thin film electrode surface and causing the external connection terminal to reach the thin film electrode.

BRIEF DESCRIPTION OF THE DRAWINGS

FIGS. 5A–5F are diagrams showing a procedure of manufacturing the surface acoustic wave device shown in FIG. 1.

FIG. 7 is a perspective exploded view showing a surface acoustic wave duplexer according to an embodiment of this invention.

DESCRIPTION OF PREFERRED EMBODIMENTS

The following describes the details of a preferred embodiment of a surface acoustic wave element according to this invention, a surface acoustic wave device, a surface acoustic wave duplexer, and a method of manufacturing the surface acoustic wave element with reference to the drawings. The same symbols are used for the same or similar elements, and when the descriptions are repeated, such descriptions are omitted.

Figure 1:
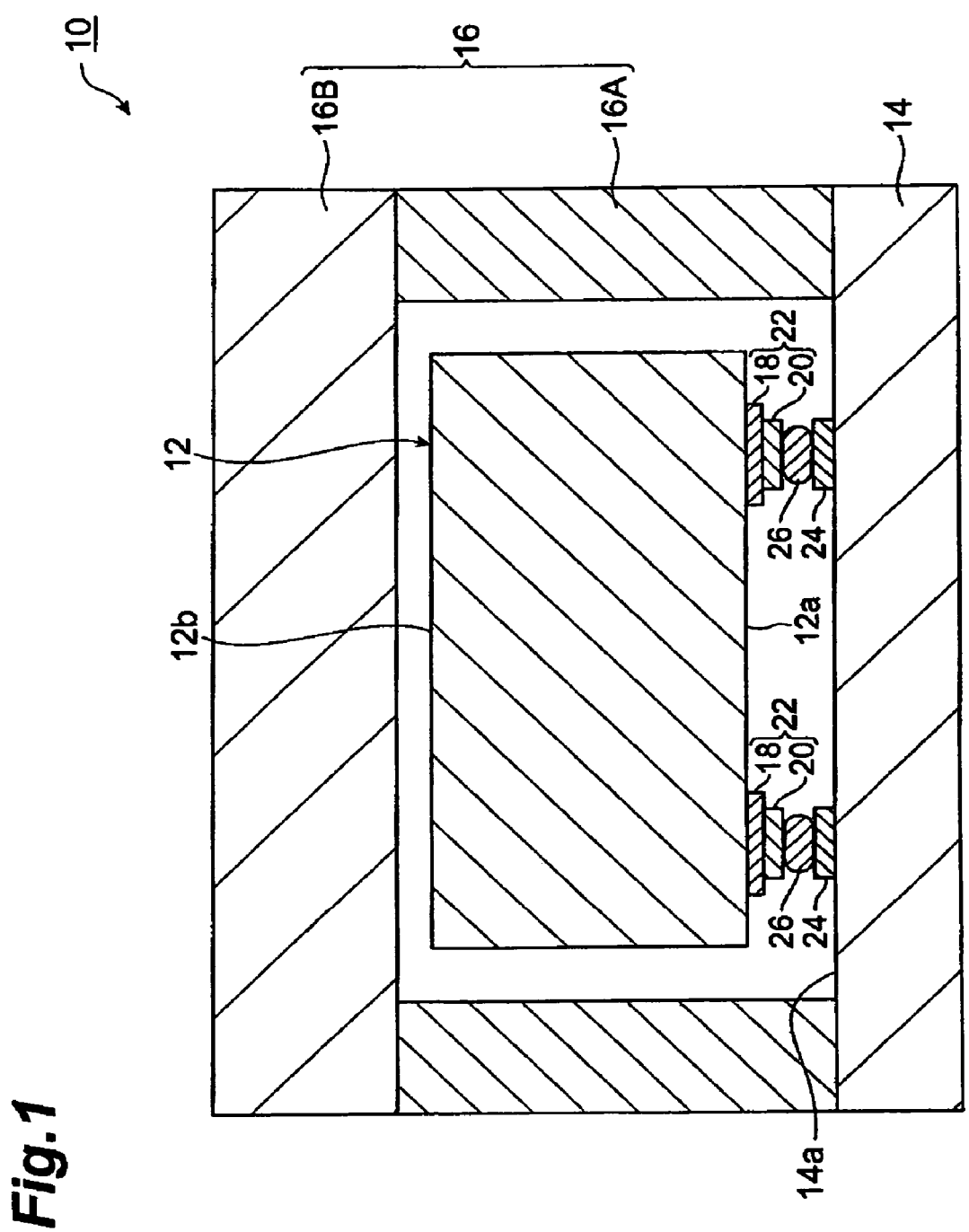
FIG. 1 is a schematic cross-sectional view of a surface acoustic wave device according to an embodiment of this invention.

FIG. 1 is a schematic cross-sectional view of a surface acoustic wave device according to an embodiment of this invention. As shown in this figure, a surface acoustic wave device 10 is provided with a surface acoustic wave element 12, a mounting substrate 14 on which the surface acoustic wave element 12 is mounted, and a cover 16 that seals the surface acoustic wave element 12. On a lower surface 12a of the surface acoustic wave element 12, three pairs of later-described pad electrodes 22 are formed in which raised electrodes 20 are laminated over input/output electrodes (thin film electrodes) 18. On a surface 14a of the mounting substrate 14 on which the surface acoustic wave element 12 is mounted, gold plating electrodes (electrode terminals) 24 for applying a voltage necessary for operating the surface acoustic wave element 12 are formed. Additionally, as shown in the figure, the surface acoustic wave element is flip-chip mounted on the mounting substrate 14 and is connected to the corresponding pad electrodes 22 of surface acoustic wave element 12 and the corresponding gold plating electrodes 24 of the mounting substrate 14 via the gold bumps (external connection terminal) 26. The cover 16 is a member for sealing and protecting the surface acoustic wave element 12 and is constituted by a dam portion 16A that surrounds the side surfaces of the surface acoustic wave element 12 from four directions and a cap portion 16B that covers an upper surface 12b of the surface acoustic wave element 12.

Next, the surface acoustic wave element 12 constituting the surface acoustic wave device 10 is more specifically explained with reference to FIG. 2. As shown in the same figure, the surface acoustic wave element 12 has a piezoelectric monocrystal substrate 28 and the pad electrodes 22 formed on the piezoelectric monocrystal substrate 28 via a buffer layer 30.

The piezoelectric monocrystal substrate 28 is a substrate which is made of lithium tantalate and has a prism shape of which the horizontal cross-section is substantially a square shape. Furthermore, lithium niobate also can be used for a material of the piezoelectric substrate.

The six pad electrodes 22 are respectively provided with input/output electrodes 18 made of monocrystal aluminum in which natural oxide films are formed on the surfaces, raised electrodes 20 made of aluminum to increase the thickness of the input/output electrodes 18, and intermediate layers (not shown in FIG. 2), which will be discussed later, inserted between the input/output electrodes 18 and the raised electrodes 20. The buffer layers 30 which are formed for monocrystallizing the input/output electrodes 18 are formed from TiN having a lattice constant between a lattice constant of lithium tantalate which is a material of the piezoelectric monocrystal substrate 28 and a lattice constant of aluminum which is a material of the input/output electrodes 18. Furthermore, monocrystal aluminum of this specification refers to an aluminum film which was epitaxially grown in a monocrystal substrate and also includes monocrystal having a small amount of grain boundaries, and to a highly oriented multicrystalline film, in addition to a perfect monocrystalline aluminum film with no grain boundaries. (Furthermore, monocrystal in this specification also includes monocrystal having a small amount of grain boundaries, and multicrystal with high orientation, in addition to perfect monocrystal with no grain boundaries.)

Nine throughholes 31 are formed in the raised electrodes 20 of the respective pad electrodes 22. The throughholes 31 extend in a height direction of the raised electrodes 20, i.e., in a laminated direction of the input/output electrodes 18 and the raised electrodes 20. These nine throughholes 31 have a square-shaped cross section and are arranged in a 3×3 matrix.

Figure 2:
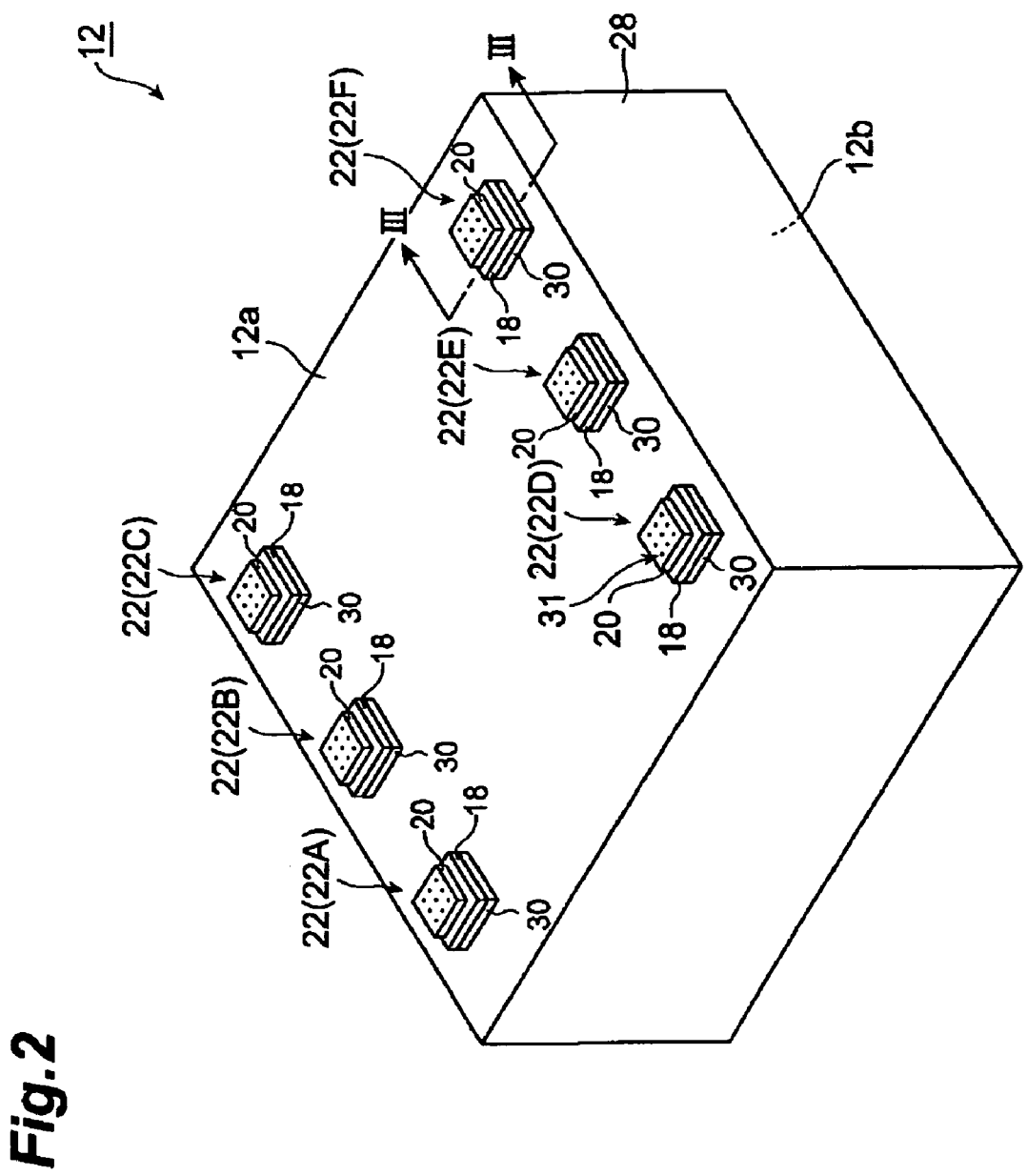
FIG. 2 is a schematic perspective view showing a surface acoustic wave element.
Figure 3:
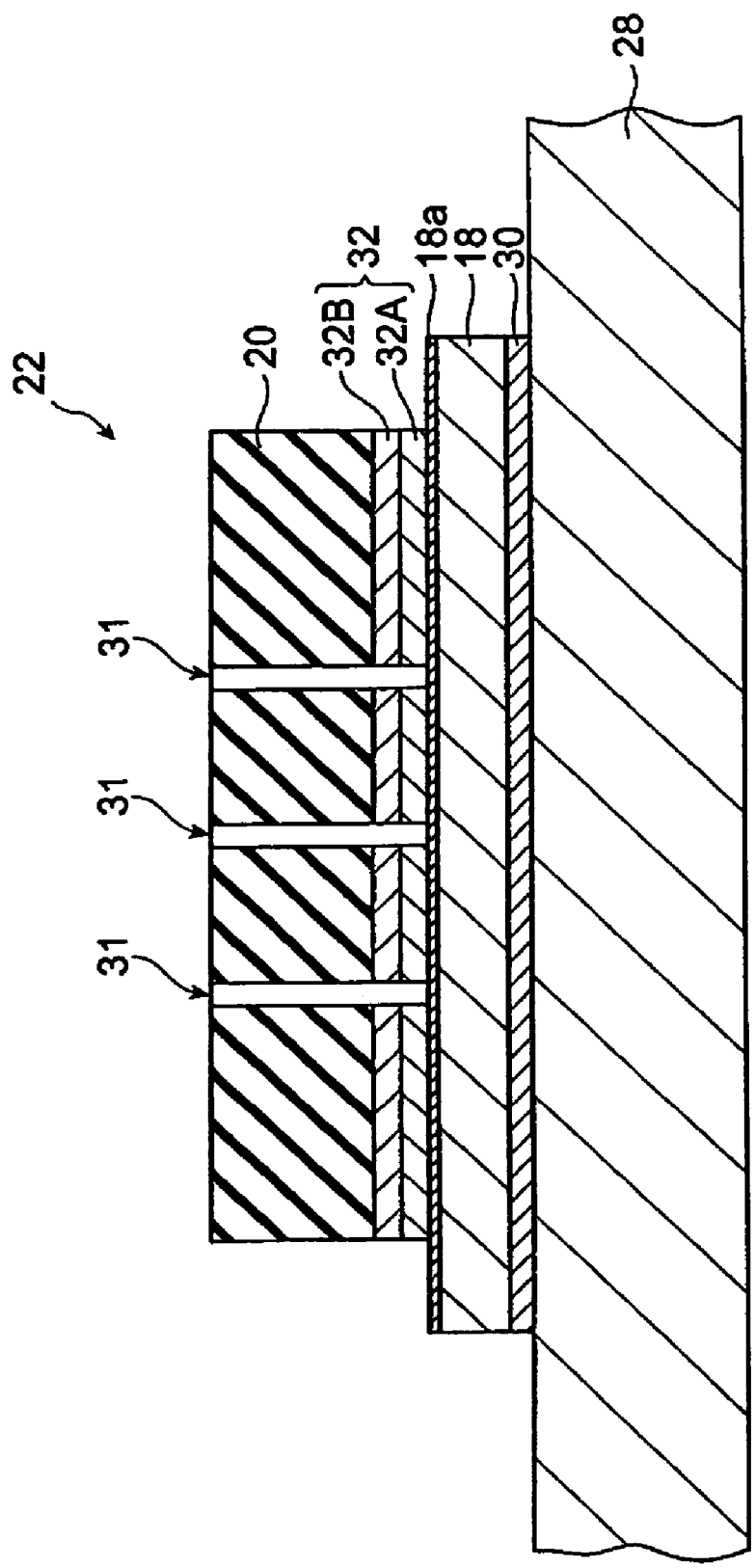
FIG. 3 is a III—III cross-sectional view of the surface acoustic wave element shown in FIG. 2.

The following explains a structure of the pad electrodes 22 in detail with reference to FIG. 3. FIG. 3 is a cross-sectional view corresponding to a III—III line direction of the pad electrode 22 of the surface acoustic wave element 12 shown in FIG. 2.

As shown in FIG. 3, the pad electrode 22 has a structure in which the input/output electrode 18, the intermediate layer 32, and the raised electrode 20 are formed in order on the buffer layer 30 formed in the piezoelectric monocrystal substrate 28. With respect to the input/output electrode 18, patterning of a monocrystal aluminum electrode film (which will be discussed later) is performed in which epitaxial formation is performed on the buffer layer 30. An oxide film 18a is formed on the surface. Furthermore, on the input/output electrode 18, the intermediate layer 32 is laminated via the oxide film 18a. The intermediate layer 32 is formed from a chrome (Cr) adhesion reinforcement layer 32A and a titanium nitride (TiN) diffusion barrier layer 32B laminated on the adhesion reinforcement layer 32A. The adhesion reinforcement layer 32A improves adhesion between the input/output electrode 18 and the raised electrode 20. The diffusion barrier layer 32B controls a state in which Au atoms of gold bumps 26 (see FIG. 1) arranged on the raised electrodes 20 are diffused in the input/output electrodes 18. Additionally, on the intermediate layer 32, the raised electrode 20 which improves adhesion of the gold bump 26 is formed. Furthermore, in the raised electrode 20 and the intermediate layer 32, the nine throughholes 31 which are extended in the height direction are formed by etching. Furthermore, with respect to the pad electrode 22 in this state, because the oxide film 18a formed on the surface of the input/output electrode 18 exists, conduction between the raised electrode 20 and the input/output electrode 18 is not achieved. Because of this, the bumps 26 and the input/output electrodes 18 are not electrically connected by simply arranging the gold bumps 26 on the raised electrodes 20 in this state.

In FIG. 2, three pad electrodes 22 are arranged along each of two opposite sides of the piezoelectric monocrystal substrate 28. Furthermore, the three pad electrodes 22 along each side are arranged at an equal interval, centered on the pad electrode 22 positioned at the middle of that side. By arranging the pad electrodes 22 in this manner, when the surface acoustic wave element 12 is flip-chip mounted on the mounting substrate 14, the centroid of the surface acoustic wave element 12 and the centroid of the piezoelectric monocrystal substrate 28 are aligned in a direction normal to the surface of the mounting substrate 14, so the surface acoustic wave element 12 has high stability.

Figure 4:
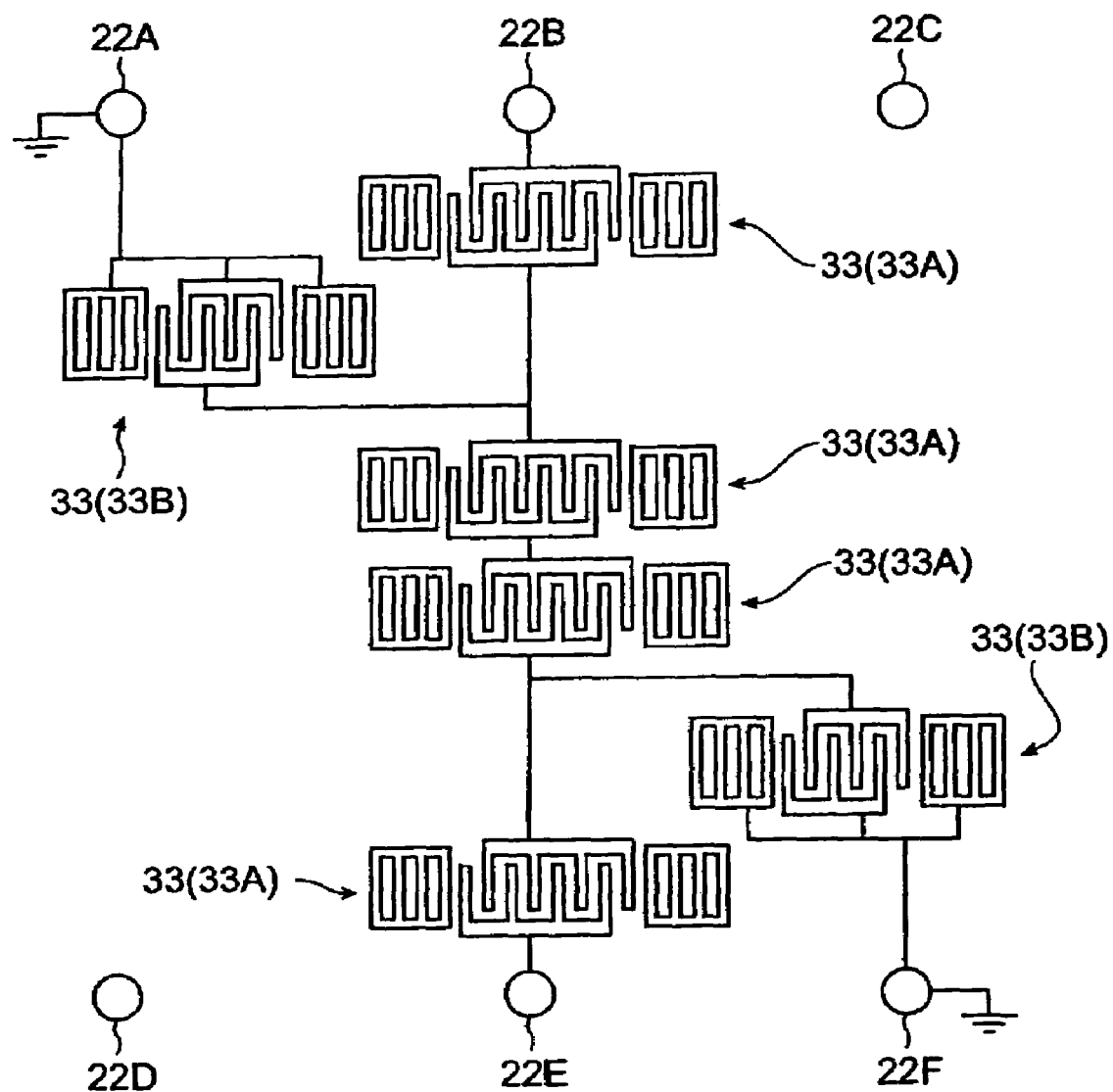
FIG. 4 is a schematic structural view showing an electrode pattern formed on the surface acoustic wave element.

Additionally, this is omitted in FIG. 2, but as shown in FIG. 4, comb-shaped electrodes and predetermined wiring patterns in addition to the pad electrodes 22 are formed on the surface 12a of the surface acoustic wave element 12. FIG. 4 is a schematic structural diagram showing electrode patterns formed on the surface acoustic wave element 12. Symbols 22A–22F correspond to the pad electrodes 22A–22F, respectively, as shown in FIG. 2, and the four pad electrodes 22A, 22B, 22E, and 22F are connected to six ladder-type comb-shaped electrodes 33. Specifically, the four comb-shaped electrodes 33 (serial arm resonators 33A) are connected in series between the pad electrode 22B and the pad electrode 22E that are positioned in the center. Additionally, wires are brought out from wiring positions that sandwich the two serial arm resonators 33A in the center and are connected to the pad electrode 22A and the pad electrode 22F, respectively, via the comb-shaped electrodes 33 (parallel arm resonators 33B). The pad electrode 22A and the pad electrode 22F are connected to ground.

Additionally, the electrode pattern is not limited to the one shown in FIG. 3, and the number of the comb-shaped electrodes 33, the wiring patterns, or the like can be changed. However, by using an electrode pattern with a relationship of point symmetry, such as the electrode patterns shown in FIG. 4, when the surface acoustic wave element 12 is flip-chip mounted on the mounting substrate 14, the centroid of the surface acoustic wave element 12 and the centroid of the piezoelectric monocrystal substrate 28 can be aligned in the normal line direction of the surface of the mounting substrate 14. Therefore, the stability of the surface acoustic wave element 12 can be improved.

The following explains a procedure of manufacturing the surface acoustic wave device 10 shown in FIG. 1 with reference to FIGS. 5A–5F. Each diagram shows a procedure of manufacturing the surface acoustic wave device 10 shown in FIG. 1.

First, a piezoelectric monocrystal substrate 28 having a three-inch diameter was prepared. After a surface 28a of the piezoelectric monocrystal substrate 28 was ultrasonically cleansed with acetone and isopropyl alcohol, it was cleansed with distilled water replacing organic solvent with distilled water. After impurities attached to the surface 28a were thus removed, the piezoelectric monocrystal substrate 28 was placed in a sputtering apparatus so that the surface 28a would face the direction of a target material. Then, by using a tantalum metal which has 99.9% purity as a target material, sputtering is performed in a mixed gas atmosphere of nitrogen and argon to form the TiN buffer layer 30 on the entire surface 28a of the piezoelectric monocrystal substrate 28 (see FIG. 5A).

After the buffer layer 30 is formed on the piezoelectric monocrystal substrate 28, while a vacuum is maintained inside of the sputtering apparatus, the target material is changed to aluminum, and an aluminum electrode film 34 having a thickness of approximately 300 nm is formed on the piezoelectric monocrystal substrate 28 (see FIG. 5B). After that, the piezoelectric monocrystal substrate 28 is removed from the sputtering apparatus, and by using well-known photolithographic (photoetching) techniques with respect to the buffer layer 30 and the electrode film 34, a number of the above-described electrode patterns corresponding to the number of elements to be formed (e.g., 200 elements) are manufactured (see FIG. 5C). At this time, an electrode pattern including the input/output electrode 18 is exposed to air, so a natural oxide film ($Al_2O_3$ film), which is insulative, is formed on the surface.

After that, while the substrate 28 is again set within the sputtering apparatus and is held in a vacuum, the intermediate layer 32 and the raised electrode 20 are continuously formed using the same procedure as in manufacturing the input/output electrode 18. Furthermore, the throughholes 31 (see FIG. 3) which go through the intermediate layer 32 and the raised electrode 20 are formed by using well-known photolithographic (photoetching) techniques. The throughholes 31 are formed so as to be extended in the height direction of the raised electrode 20, i.e., the laminated direction of the input/output electrode 18 and the raised electrode 20. In addition, at the time of etching the raised electrode 20, the chrome adhesion reinforcement layer 32A of the intermediate layer 32 can be used as an etch stop layer.

Thus, manufacturing of the above-mentioned surface acoustic wave element 12 is completed. Furthermore, a spheroid of Au manufactured by a bump bonder is pressed against the respective raised electrodes 20 of the surface acoustic wave element 12, and ultrasonic vibration is added; thus, the bumps 26 are formed (see FIG. 5D). This type of formation technique of the gold bumps 26 is popular, and the gold bumps 26 can be easily formed by using conventional techniques.

Figure 6:
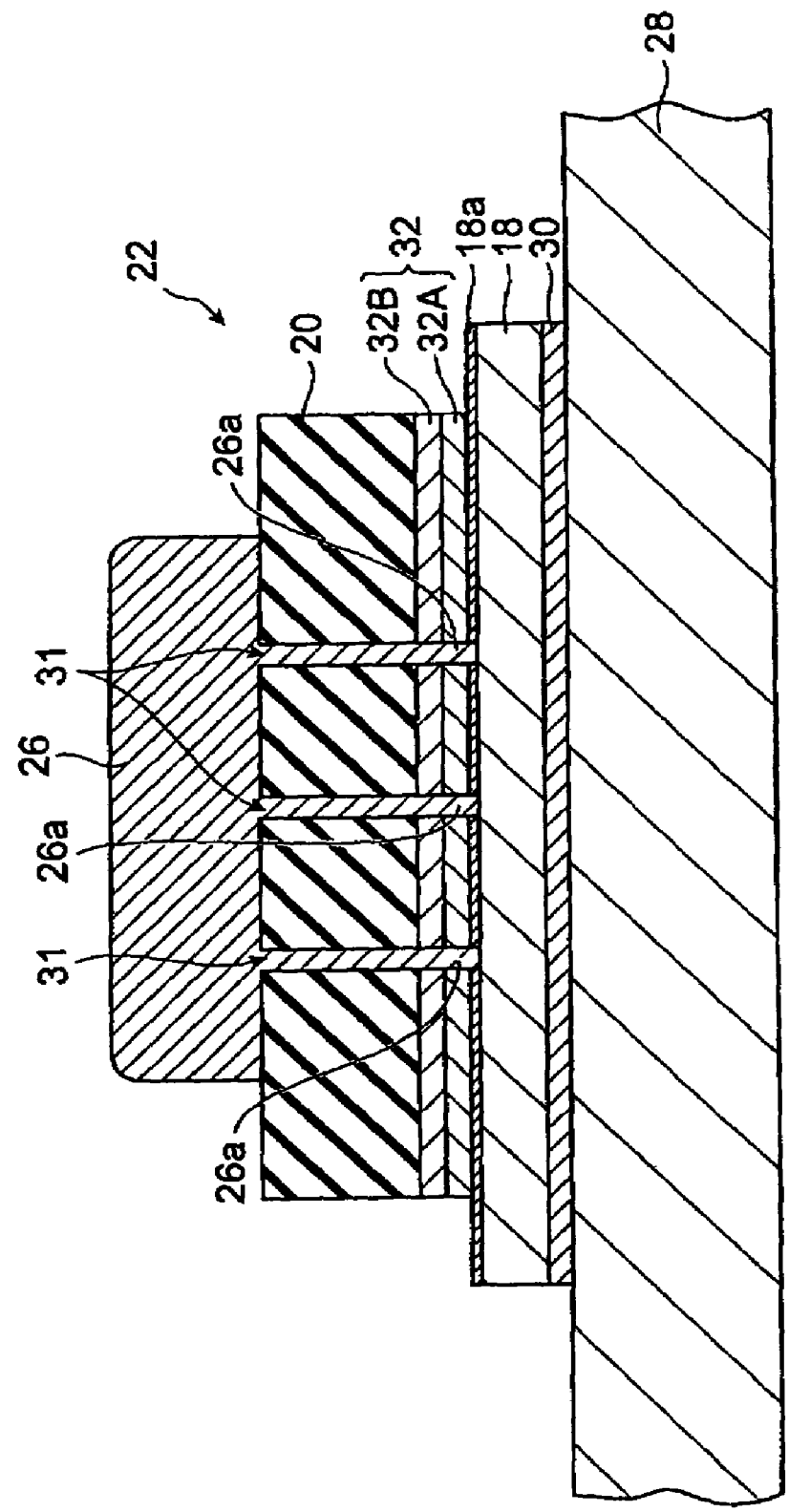
FIG. 6 is a diagram showing a state in which part of a bump enters throughholes of a raised electrode.

Next, a state in which the bumps 26 are formed on the raised electrodes 20 of the pad electrodes 22 is explained with reference to FIGS. 3 and 6. FIG. 6 is a diagram showing a state in which part of the bump 26 enters the throughholes 31 of the raised electrode 20. As shown in FIG. 6, the bump 26 which is pressed against the raised electrode 20 and to which ultrasonic vibration is added is plastically-deformed so that the part enters the throughholes 31 formed in the raised electrode 20 and the intermediate layer 32. Furthermore, tip portions 26a of the bump 26 which entered the throughholes 31 and reached the oxide film 18a of the input/output electrode 18 rubs the surface of the oxide film 18a, and the oxide film 18a of the portion rubbed by the bump 26 breaks. The tip portions 26a of the bumps 26 which entered the throughholes 31 go through the portion in which the oxide film 18a broke, and reach the input/output electrode 18. By doing this, in the vicinity of the portion in which the oxide film 18 broke, the gold atoms of the bumps 26 are diffused within monocrystal aluminum constituting the input/output electrode 18, and an adhesion strength between the raised electrodes 20 and the input/output electrodes 18 is improved by the anchoring effect thereof. Simultaneously, electrical conduction between the raised electrode 20 and the input/output electrode 18 is improved. Furthermore, part of the Au atoms constituting the bump 26 are diffused within aluminum of the raised electrode 20.

In FIG. 5E, the surface acoustic wave element 12 is flip-chip mounted on the BT resin mounting substrate 14 after the bumps 26 are formed. That is, the surface acoustic wave element 12 is mounted over the mounting substrate 14 while positioning is performed so that the bumps 26 contact the metal plating electrodes 24 of the mounting substrate 14 in a state in which the surface 12a on which the bumps 26 are formed faces the element mounting surface 14a of the mounting substrate 14. After the surface acoustic wave element 12 is mounted on the mounting substrate 14, the surface acoustic wave element 12 is held by vacuum suction, using a collet (not shown) and is ultrasonically-vibrated in the surface direction of the mounting substrate 14, to join the bumps 26 with the gold plated electrodes 24 (see FIG. 5E) Finally, after each surface acoustic wave element 12 is sealed by covering a BT resin dam portion plate in a lattice-shaped pattern (thickness: 0.4 nm) and a BT resin flat cap plate (thickness: 0.2 nm) on the mounting substrate 14, manufacturing of each device of the surface acoustic wave element 10 is completed by a dicing processing (see FIG. 5F). The mounting substrate 14 and the dam portion plate (dam portion 16A), and the dam portion plate and the cap plate (cap portion 16B) are adhered by a resin adhesive.

Thus, as explained in detail, the raised electrodes 20 formed on the input/output electrode 18 have the throughholes 31. Furthermore, part of the bump 26 (entering (or tip) portions 26a) enter the throughholes 31. Additionally, by applying ultrasonic vibration to the bump 26, the entering portions 26a of the bump 26 further go through the oxide film 18a and reach the input/output electrode 18. By doing this, the bump 26 and the input/output electrode 18 are electrically connected via the entering portions 26a of the bump 26 which fill the throughholes 31. Therefore, even if the solid oxide film 18a is formed on the surface of the input/output electrode 18 formed from monocrystal aluminum, conduction between the input/output electrode 18 and the bump 26 can be achieved with high accuracy.

The following explains a surface acoustic wave duplexer provided with the above-mentioned surface acoustic wave element 12 with reference to FIG. 7. FIG. 7 is a perspective exploded view showing a surface acoustic wave duplexer according to an embodiment of this invention. This surface acoustic wave duplexer 40 is an electronic part which accommodates, in one package, a sending filter and a receiving filter which are used in a transmission portion and a receiving portion, respectively, of a portable telephone, using a branch circuit so as to use one antenna in common. Therefore, the surface acoustic wave duplexer 40 is provided with two surface acoustic wave elements 12 with different corresponding frequencies. Additionally, the above-mentioned cover 16 is used so as to seal the two surface acoustic wave elements 12 mounted on the mounting substrate 14. Furthermore, on the rear side of the mounting surface of the surface acoustic wave element 12 of the mounting substrate 14, two circuit boards 42 in which square-wave-shaped delay circuits are arranged are laminated via insulating plates 44, respectively. In this type of surface acoustic wave duplexer 40 as well, in the same manner as in the above-mentioned surface acoustic wave device 10, even if the solid oxide film 18a is formed on the surface of the input/output electrode 18 formed from monocrystal aluminum, conduction between the input/output electrode 18 and the bump 26 is achieved with high accuracy.

This invention is not limited to the above-mentioned embodiment, but various modifications are possible. For example, the number of throughholes, their cross-sectional shape, and their arrangement can be appropriately changed. Furthermore, the raised electrodes in which throughholes are formed also can be manufactured by using lift-off techniques. In this case, the above-mentioned etch stop layer is not needed. In addition, a target material for the electrode film formation film is not limited to aluminum, but, for example, aluminum alloy also is acceptable, in which Cu, Ta, W, Ti, or the like is added to aluminum.

The structural material of the buffer layer is not limited to TiN, but a material also is acceptable which has a lattice constant between a lattice constant of the material of the electrode film and a lattice constant of the material of the piezoelectric monocrystal substrate. Furthermore, the buffer layer also is acceptable which has a double layer structure of at least two layers including at least a TiN layer and a Ti layer. In addition, it also is preferable that the buffer layer has a structure in which a composition ratio of nitrogen decreases so as to gradually change from titanium nitride to titanium as it approaches the layer growth surface. Thus, when the aluminum electrode film is laminated on the piezoelectric monocrystal substrate via the buffer layer in which the composition ratio of nitrogen changes, a (111) plane which is the most dense surface of aluminum appears on the surface of the aluminum electrode film.

EXAMPLE 1

A 39°-rotated Y-cut lithium tantalate substrate was prepared as a piezoelectric monocrystal substrate (diameter: 76.2 mm; thickness: 0.35 mm). According to the sputtering method, a TiN buffer layer and a monocrystal aluminum electrode film were laminated in order on the substrate The following shows a specific procedure.

First, prior to sputtering, ultrasonic cleansing was performed with acetone and isopropyl alcohol, organic solvent substitution was performed with pure water, and cleansing was performed. Then, a TiN buffer layer having a thickness of 4 nm was formed on the substrate, using titanium metal of 99.9% purity as a target material. After forming the TiN buffer layer on the substrate, while a vacuum was maintained inside of the sputtering apparatus, an aluminum electrode film having a thickness of approximately 150 nm was formed using aluminum of 99.999% purity as a target material. The thickness of this aluminum electrode film is a parameter which regulates an operation frequency of the surface acoustic wave device and can be appropriately changed according to the product to be formed. Furthermore, the condition of the substrate temperature is 100–150° C., the formation film rate for the buffer layer is 0.1–0.5 nm/second, and the formation film rate for the aluminum electrode film is approximately 3 nm/seconds. Furthermore, this aluminum electrode film is monocrystallized because the lower layer is a Ti buffer layer, which is confirmed by a selected-area electron diffraction or the like.

This monocrystal aluminum electrode was formed into an electrode pattern by using general photolithographic techniques. Specifically, a mask pattern of a photoresist was formed on the aluminum electrode film, the aluminum electrode film was dry-etched with a mixed gas of boron trichloride ($BCl_3$) and chloride ($Cl_2$), and the electrode pattern was patterned. Ti of the buffer layer can be removed by a mixed gas of $CF_4$ and oxygen $O_2$ at the time of photoresist ashing.

Next, the intermediate layer and the raised electrode are formed on the entire substrate. As an intermediate layer, it is preferable that a double structure is used in which a first layer is formed from chrome and which forms TiN thereon. The chrome layer functions as an etch stop layer at the time of forming an input/output terminal. The thickness of this chrome layer is not particularly limited, but approximately 50–150 nm is preferable. The TiN layer is formed with a thickness of 2–50 nm. This TiN layer uses metal titanium as a target material and is formed by sputtering in a mixed gas atmosphere of nitrogen and argon. It is appropriate that the thickness of the raised electrode should be 0.5–1 μm.

Next, by performing an etching process on the intermediate layer and the raised electrode, the pad electrode is formed. At the time of this etching, throughholes also are formed, a throughhole has a 3 μm×3 μm square-shaped cross-section. Throughholes are arranged at a 5 μm interval and are formed in a 3×3 matrix. Furthermore, because of the above-mentioned etch stop layer, strict control of an etching state is not needed, and element manufacturing can be easily performed. Furthermore, the same method for etching of the above-mentioned buffer layer is used for etching of the intermediate layer. In etching of the intermediate layer, the lower input/output electrode (monocrystal aluminum) functions as an etch stop layer, so the etching processing also can be easily performed.

A bump is formed on a pad electrode formed by etching. It is preferable that this bump material should be gold. For formation of the bump electrode, the tip of an Au fine wire with a diameter of 25 μm is melted by a bump bonder, and a sphere with a diameter of approximately 45 μm is formed. This is pressed against the pad electrode, and ultrasonic vibration is applied. Then, Au enters the throughholes and reaches the oxide film of the input/output electrode. A diameter of Au in the spheroidal shape is enlarged by pressing to approximately 65 μm. Additionally, under the throughholes, the oxide film of the input/output electrode is destroyed by Au because of ultrasonic vibration, and a desired Au dispersion route is formed. Furthermore, the oxide film of the portion in which throughholes are not formed is hardly destroyed because the raised electrode is buffered Thus, in the same manner as in the TiN layer, the oxide film functions as a barrier layer for the Au diffusion.

After a gold bump is formed, heat processing is performed which improves diffusion of a desired Au route. As a heat processing condition, for example, approximately 30 minutes at 200° C. is preferable.

As described above, the surface acoustic wave device was manufactured by dicing the piezoelectric monocrystal substrate at a predetermined dimension. Additionally, the surface acoustic wave device was manufactured by flip-chip mounting this element to the mounting substrate and sealing this with the cover. Furthermore, the dimension of the surface acoustic wave element is 1.3 mm×0.8 mm. Three bump electrodes are formed along each of the opposite sides, for a total of six electrodes. In addition, the external dimension of the surface acoustic wave device was 2.5 mm×2.0 mm×0.9 mm.

For comparison with this example of the invention, 20 surface acoustic wave devices in which throughholes are formed and 20 surface acoustic wave devices different from the above-mentioned surface acoustic wave device, without throughholes, were prepared. Then, electrical characteristics were first evaluated. As a result, compared to the surface acoustic wave devices with throughholes, the surface acoustic wave devices without throughholes show that insertion loss was deteriorated by 0.3 dB. Next, comparison testing concerning joint strength between the bumps and pad electrodes was performed. During the testing, a surface acoustic wave device was dropped onto a concrete surface from a height of 0.5 m three times, and the bump portion was checked for wire breakage. With respect to the samples in which a wire breakage was not confirmed, testing was performed in which the dropping height was gradually increased to 1.0 m, 1.5 m, and 2.0 m. The state of wire breakage was checked. The result is shown in the following Table 1.

TABLE 1

| Height (m) | With throughholes | Without throughholes |
|---|---|---|
| 0.5 | 0/20 | 1/20 |
| 1.0 | 0/20 | 3/19 |
| 1.5 | 0/20 | 3/16 |
| 2.0 | 0/20 | 2/13 |

Table 1 shows the number of wire breaks (numerator) at each height and the total number of samples of drop testing (denominator). Furthermore, in the section of "without throughholes" in Table 1, denominators gradually change due to the generation of wire breaks. According to this result, with respect to the surface acoustic wave devices with throughholes, compared to the surface acoustic wave devices without throughholes, it is understood that the joint strength between the bump and the pad electrode is strengthened.

As explained above, according to this invention, a surface acoustic wave element which can improve conduction with an external connection terminal with high accuracy even if an electrode film is monocrystal, a surface acoustic wave device, a surface acoustic wave duplexer, and a method of manufacturing the surface acoustic wave element are provided.

The invention claimed is:

1. A surface acoustic wave element, comprising:
   a thin film electrode which is formed on a piezoelectric monocrystal substrate via a buffer layer, and is formed from monocrystal aluminum having an oxide film on a surface thereof;
   a raised electrode which is formed on the thin film electrode and is provided with a throughhole; and
   an external connection terminal which is arranged on the raised electrode, part of the external connection terminal entering the throughhole, going through the oxide film, and electrically connected to the thin film electrode.

2. The surface acoustic wave element as set forth in claim 1, wherein:
   the external connection terminal is a gold bump terminal.

3. The surface acoustic wave element as set forth in claim 1, wherein:
   the raised electrode is formed from one of aluminum or gold-aluminum alloy.

4. The surface acoustic wave element as set forth in claim 1, wherein:
   an adhesion reinforcement layer which improves adhesion between the thin film electrode and the raised electrode is disposed between the thin film electrode and the raised electrode.

5. The surface acoustic wave element as set forth in claim 4, wherein:
   the adhesion reinforcement layer is formed from chrome.

6. The surface acoustic wave element as set forth in claim 1, wherein:
   a diffusion barrier layer which suppresses diffusion of atoms constituting the external connection terminal to the thin film electrode is disposed between the thin film electrode and the raised electrode.

7. The surface acoustic wave element as set forth in claim 6, wherein:
   the diffusion barrier layer is formed from titanium nitride.

8. The surface acoustic wave element as set forth in claim 1, wherein:
   the buffer layer is formed from titanium or titanium nitride.

9. The surface acoustic wave element as set forth in claim 1, wherein:
   the buffer layer is provided with a laminated structure formed from at least two layers, including a titanium layer and a titanium nitride layer.

10. The surface acoustic wave element as set forth in claim 1, wherein:
    the buffer layer has a structure in which a composition ratio of nitrogen decreases so as to change from titanium nitride to titanium as the buffer layer approaches a layer growth surface.

11. The surface acoustic wave element as set forth in claim 1, wherein:
    the throughhole extends in a height direction of the raised electrode.

12. The surface acoustic wave element as set forth in claim 1, wherein:
    the throughhole extends in a lamination direction of the raised electrode and the thin film electrode.

13. A surface acoustic wave duplexer, comprising:
    a surface acoustic wave element provided with a thin film electrode which is formed on a piezoelectric monocrystal substrate via a buffer layer, and is formed from monocrystal aluminum having an oxide film on a surface thereof, a raised electrode which is formed on the thin film electrode and is provided with a throughhole, and an external connection terminal which is arranged on the raised electrode, part of the external connection terminal entering the throughhole, going through the oxide film, and electrically connected to the thin film electrode.

14. A surface acoustic wave device, comprising:
    a surface acoustic wave element provided with a thin film electrode which is formed on a piezoelectric monocrystal substrate via a buffer layer, and is formed from monocrystal aluminum having an oxide film on a surface thereof, a raised electrode which is formed on the thin film electrode and is provided with a throughhole, and an external connection terminal which is arranged on the raised electrode, part of the external connection terminal entering the throughhole, going through the oxide film, and electrically connected to the thin film electrode; and
    a mounting substrate having an electrode terminal formed on a surface on which the surface acoustic wave element is mounted, the surface acoustic wave element being mounted on the mounting substrate so that the electrode terminal and the raised electrode of the surface acoustic wave element are connected via the external connection terminal.

15. A method of manufacturing a surface acoustic wave element, comprising the steps of:
    laminating a buffer layer on a piezoelectric monocrystal substrate;
    laminating an electrode film formed from monocrystal aluminum on the piezoelectric monocrystal substrate via the buffer layer;

forming a thin film electrode by patterning the electrode film and forming an oxide film on a surface of the thin film electrode;

forming a raised electrode having a throughhole on the thin film electrode;

pressing an external connection terminal against the raised electrode and causing a part of the external connection terminal to enter the throughhole; and vibrating the external connection terminal, causing the external connection terminal that has entered the throughhole to go through the oxide film of the thin film electrode surface and causing the external connection terminal to reach the thin film electrode.

16. The method of manufacturing the surface acoustic wave element as set forth in claim 15, wherein:

the throughhole is formed so as to extend in a lamination direction of the raised electrode and the thin film electrode.

17. The method of manufacturing a surface acoustic wave element as set forth in claim 15, wherein:

the throughhole is formed so as to extend in a height direction of the raised electrode.

* * * * *